United States Patent
Megrant

(10) Patent No.: US 12,288,687 B2
(45) Date of Patent: *Apr. 29, 2025

(54) FABRICATING A DEVICE USING A MULTILAYER STACK

(71) Applicant: Google LLC, Mountain View, CA (US)

(72) Inventor: Anthony Edward Megrant, Goleta, CA (US)

(73) Assignee: Google LLC, Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/438,142

(22) Filed: Feb. 9, 2024

(65) Prior Publication Data

US 2024/0186143 A1    Jun. 6, 2024

Related U.S. Application Data

(63) Continuation of application No. 16/640,411, filed as application No. PCT/US2017/065018 on Dec. 7, 2017, now Pat. No. 11,935,748.

(60) Provisional application No. 62/552,743, filed on Aug. 31, 2017.

(51) Int. Cl.
 G03F 7/09    (2006.01)
 H01L 21/027  (2006.01)
 H01L 21/3213 (2006.01)

(52) U.S. Cl.
 CPC .......... *H01L 21/0274* (2013.01); *G03F 7/094* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 5,219,713 A | 6/1993 | Robinson | |
| 5,275,695 A | 1/1994 | Chang et al. | |
| 5,888,901 A | 3/1999 | Grivna | |
| 6,870,158 B1 | 3/2005 | Blain | |
| 9,302,905 B1 | 4/2016 | Sampath | |
| 11,935,748 B2* | 3/2024 | Megrant | H10N 60/01 |
| 2005/0100830 A1 | 5/2005 | Xu et al. | |
| 2006/0007025 A1 | 1/2006 | Sharma | |
| 2008/0124852 A1 | 5/2008 | Ahn et al. | |
| 2009/0111061 A1 | 4/2009 | Chau et al. | |
| 2009/0159930 A1 | 6/2009 | Smorchkova | |
| 2010/0276698 A1 | 11/2010 | Moore et al. | |
| 2016/0260904 A1 | 9/2016 | Park et al. | |
| 2017/0162513 A1 | 6/2017 | Kelliher et al. | |

FOREIGN PATENT DOCUMENTS

| | | |
|---|---|---|
| CN | 103258719 | 8/2013 |
| EP | 0545816 | 6/1993 |
| JP | 6378531 | 4/1988 |
| JP | H01-283887 | 11/1989 |
| JP | H05-74696 | 3/1993 |
| JP | H05-167119 | 7/1993 |
| JP | 2000-321756 | 11/2000 |
| JP | 2001-201871 | 7/2001 |
| JP | 2006-165507 | 6/2006 |
| JP | 2006-044238 | 2/2008 |
| JP | 2013-500606 | 1/2013 |
| JP | 6089907 | 3/2017 |
| KR | 10-2007-0029266 | 3/2007 |
| WO | WO 199215406 | 9/1992 |

OTHER PUBLICATIONS

Office Action in Chinese Appln. No. 201780094508.4, mailed on Feb. 26, 2024, 13 pages (with English translation).
Cui et al., "High resolution electron beam lithography of PMG1 using solvent developers" Microelectronic Engineering, 85, 2008, 810-813.
International Preliminary Report on Patentability in International Appln. No. PCT/US2017/065018, mailed on Nov. 29, 2019, 9 pages.
International Search Report and Written Opinion in International Appln. No. PCT/US2017/065018, mailed on Jun. 7, 2018, 21 pages.
International Written Opinion in International Appln. No. PCT/US2017/065018, mailed on Jul. 26, 2019, 8 pages.
Notice of Allowance in Australian Appln. No. 2017429631, mailed on Feb. 12, 2021, 3 pages.
Notice of Allowance in Japanese Appln. No. 2020-512459, mailed on Oct. 3, 2022, 5 pages.
Office Action in Australian Appln. No. 2017429631, mailed on Jul. 15, 2020, 3 pages.
Office Action in Canadian Appln. No. 3,074,121, mailed on Apr. 21, 2021, 6 pages.
Office Action in Canadian Appln. No. 3,074,121, mailed on Aug. 17, 2022, 6 pages.
Office Action in Canadian Appln. No. 3,074,121, mailed on May 11, 2023, 4 pages.
Office Action in Chinese Appln. No. 201780094508.4, mailed on Mar. 1, 2023, 15 pages (with English translation).
Office Action in Chinese Appln. No. 201780094508.4, mailed on Nov. 30, 2023, 11 pages (with English translation).
Office Action in Japanese Appln. No. 2020-512459, mailed on Aug. 2, 2021, 10 pages (with English translation).
Office Action in Japanese Appln. No. 2020-512459, mailed on Mar. 7, 2022, 6 pages (with English translation).
Office Action in Korean Appln. No. 10-2020-7008406, mailed on Aug. 19, 2021, 11 pages (with English translation).

* cited by examiner

*Primary Examiner* — Daborah Chacko-Davis
(74) *Attorney, Agent, or Firm* — Fish & Richardson P.C.

(57) ABSTRACT

A method of fabricating a device is presented. The method includes forming a multilayer stack on a substrate which has a principal surface. The multilayer stack includes a supporting layer formed over the principal surface of the substrate and a photoresist layer formed on the supporting layer, patterning the multilayer stack to form at least one opening such that the photoresist layer is undercut by the supporting layer and anisotropically dry etching the substrate.

18 Claims, 5 Drawing Sheets

FABRICATING A DEVICE USING A MULTILAYER STACK

CROSS-REFERENCE TO RELATED APPLICATIONS

This application is a continuation of U.S. application Ser. No. 16/640,411, filed Feb. 20, 2020, which is a National Stage Application under 35 U.S.C. § 371 and claims the benefit of International Application No. PCT/US2017/065018, filed on Dec. 7, 2017, which, in turn, claims priority to U.S. Provisional Application Ser. No. 62/552,743, filed on Aug. 31, 2017. The disclosures of each of those prior applications are incorporated herein by reference in their entirety.

TECHNICAL FIELD

The present disclosure relates to fabricating a device using s multilayer stack.

BACKGROUND

Quantum computing is a new computing method that takes advantage of quantum mechanical phenomena, such as superposition of two quantum states and entanglement between the quantum states belonging to separate and remote entities. In contrast to a digital computer, which stores and manipulates the information using the "bits" configured to be in two bi-stable states (e.g. a "0" and "1"), quantum computing systems aim to manipulate information using "qubits" configured to be the superposition of the quantum states (e.g. a|0>+b|1>). Quantum states of each qubit can be entangled with one another, i. e., the measurement result of one qubit is strongly correlated with the measurement result of another qubit. These properties provide an crucial advantage over the classical computer that the speed of a quantum computer is exponential in the number of qubits.

SUMMARY

In general, in some aspects, the subject matter of the present disclosure may be embodied in methods of fabricating a device, which includes forming a multilayer stack on a substrate which has a principal surface, and the multilayer stack includes: a supporting layer formed over the principal surface of the substrate, and a photoresist layer formed on the supporting layer; the methods of fabricating a devices further includes: patterning the multilayer stack to form at least one opening such that the photoresist layer is undercut by the supporting layer, and anisotropically dry etching the substrate.

Implementations of the methods may include one or more of the following features. For example, in some implementations, the multilayer stack further may comprise a first layer formed on the principal surface of the substrate, the supporting layer formed over the first layer.

In some implementations, the supporting layer may be formed on the first layer.

In some implementations, wherein the supporting layer may be overcut by the first layer In some implementations, the photoresist layer and the first layer may have respective edges which are aligned.

In some implementations, the first layer is a polymeric material.

In some implementations, the polymeric material may be sensitive to electron-beam irradiation.

In some implementations, the polymeric material may be methyl methacrylate.

In some implementations, the polymeric material may be poly methyl methacrylate.

In some implementations, the polymeric material may be methacrylic acid.

In some implementations, the multilayer stack may be a bilayer stack.

In some implementations, patterning the multilayer resist stack may comprise developing the photoresist layer using a developer.

In some implementations, the supporting layer may be soluble in the developer.

In some implementations, the developer may be alkaline.

In some implementations, the supporting layer is a polymeric material.

In some implementations, the polymeric material may be sensitive to electron-beam irradiation.

In some implementations, the polymeric material may be polymethyalgluarimide.

In some implementations, the polymeric material may be methyl methacrylate.

In some implementations, the polymeric material may be poly methyl methacrylate.

In some implementations, the polymeric material may be methacrylic acid.

In some implementations, patterning the multilayer stack may include performing plasma ashing.

In some implementations, the device may be a quantum information processing device.

In some implementations, the substrate may comprise a layer of aluminum disposed on a silicon substrate.

In some implementations, the device may be a device obtainable by any one of the methods or implementations above.

Implementations may include one or more of the following advantages. For example, in some implementations, the method may provide a further layer of protection between the metallic layer to be patterned and the supporting layer hereinbefore described. This may improve protection around the edges of the patterned features by providing a barrier to residues, as well as allowing easier entry of the solvent for the removal step.

For the purposes of this disclosure, a superconductor (alternatively, superconducting) material may be understood as a material that exhibits superconducting properties at or below a superconducting critical temperature. Examples of superconductor material include aluminum (superconducting critical temperature of, e.g., 1.2 kelvin), niobium (superconducting critical temperature of, e.g., 9.3 kelvin) and titanium nitride (superconducting critical temperature of, e.g., 5.6 kelvin).

The details of one or more implementations are set forth in the accompanying drawings and the description below. Other features and advantages will be apparent from the description, the drawings, and the claims.

DETAILED DESCRIPTION

Figure 1A:
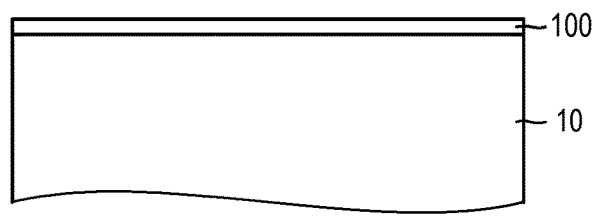
FIGS. 1A-1H and 1J-1K illustrate a process of patterning of a metallic layer on a substrate using a three-layer structure.

Quantum computing provides coherent processing of quantum information stored in a plurality of qubits of a quantum computer. To achieve maximum computational speed, ideally the qubits are entangled with one another in a controllable manner such that the quantum state of each qubit immediately affects the corresponding quantum states of the other qubits. Superconducting quantum computing is a promising implementation of quantum computing technology in which quantum circuits are formed at least in part from superconductor materials on a substrate. In certain implementations, quantum circuit elements are preferably operated at a cryogenic temperature such that thermal fluctuations do not perturb the coherence of the qubits or cause loss of the circuit elements at the operating frequency. Other factors that may lead to loss or decoherence are material defects such as two-level states (TLS) and undesired radiative coupling.

Therefore, a metallic layer, which shows superconducting behaviour below a critical temperature may be used to form various quantum circuit elements and components such as Josephson junction, co-planar waveguides, LC oscillator, superconducting quantum interference devices (SQUIDs), inductors, capacitors, among others. Superconducting quantum computing devices may be multi-layer systems, however typically only the first metallic layer forms the core of the computational basis.

Conventionally, to pattern a metallic layer on a substrate, a photoresist layer is deposited on the metallic layer and developed. These steps expose the parts of the metallic layer to be etched. A dry etch, such as ion milling, can be used to etch the exposed regions of the metallic layer. The dry etch can also be used to etch the underlying substrate once the metallic layer has been etched. After dry etching, the photoresist layer can be removed with a solvent.

A drawback of this approach is that the patterned photoresist can harden during the dry etching step due to exposure to the etchant. Consequently, parts of the hardened photoresist can remain on the metallic layer even after removing the photoresist layer with a solvent. These photoresist residues are especially problematic around the edges of the patterned features where the hardened photoresist are in direct contact with the metallic layer. The residues remaining around the edge of the metallic feature can hinder the uniform formation of the subsequent layers on the patterned metal structure, which can be critical in fabrication of a quantum information device. They may also affect the electromagnetic properties of the patterned metal structure.

To address this issue, an undercut profile is used. A supporting layer (herein also referred to as an "undercut layer") is deposited on the metallic layer and the photoresist layer can be deposited on the supporting layer. A characteristic of the supporting layer is that when developed, the supporting layer laterally recedes from the inside walls of the window formed by photolithography. Therefore, the photoresist layer and the supporting layer form an overhang feature (or "undercut profile). The materials for the supporting layer are commercially available such as polydimethylglutarimide (PMGI), LOR™ and LOL™.

Using the supporting layer, when the metal/substrate is dry-etched, the exposed part of the photoresist layer (i.e. the part which is exposed to the etch and which hardened) is not in direct contact with the metallic layer. Therefore, the use of the supporting layer can alleviate the issue of the hardened photoresist residue.

This approach, however, still does not provide perfect protection of the metallic layer for two reasons. First, although the ion milling and other forms of dry etch can be anisotropic (in other words, directionally vertical in etching) ions can still ricochet within the patterned window by reflecting off the walls defined by the photoresist layer and the supporting layer. Therefore, the supporting layer itself, in contact with the metal layer, can harden. Secondly, dry etching, in particular ion milling, is an aggressive process in that material from the metallic layer and the substrate layer is ejected from the substrate and be deposited around the exposed rim of the window formed in the metallic layer.

This disclosure concerns addressing this problem and presents a method of patterning a metallic layer on a substrate while discouraging and even avoiding dielectric/metallic residues near the edges of the patterned metallic layer. In particular, the method provides a further layer of protection (herein referred to as a "first layer", "base layer" or "protective layer") between the metallic layer to be patterned and the supporting layer hereinbefore described. This improves protection around the edges of the patterned features by providing a barrier to residues, as well as allowing easier entry of the solvent for the removal step. The level of purity achieved by this method can make an important difference especially for quantum information devices. In some implementations, dielectric residue in contact with the metallic structure leads to loss at the operating frequency of several GHz, which affects the key parameters of the device, such as the coherence time of the qubit or the quality factor of a resonator.

FIGS. 1A-1H and 1J-1K illustrate an example of a process of photolithographic patterning of a metallic layer on a substrate. In particular, the example process depicted in FIGS. 1A-1H and 1J-1K illustrates a cross-sectional view of formation of three metallic regions from the metallic layer deposited on a substrate, by forming two trenches. This method will now be described with reference to FIGS. 1 and 2.

Referring to FIG. 1A, a metallic layer 100 may be deposited on a substrate 10. The metallic layer 100 may not require any adhesion promotor to stick to the substrate and provides a stable layer on the substrate 10. The metallic layer 100 may take the form of a layer of aluminum and the substrate 10 may take the form of silicon, such as, for example, p-type (100) silicon. The combination of aluminum and silicon can be used for implementing quantum information processing devices including superconducting qubits. However, given that the current method can be used for any other metallic layers and substrates, the choices of material are not limited to these. For example, the substrate 10 may be a sapphire wafer. In case the metallic layer 100 is an aluminum layer, the metallic layer 100 may be around 100 nm thick and can be polycrystalline.

Figure 1B:
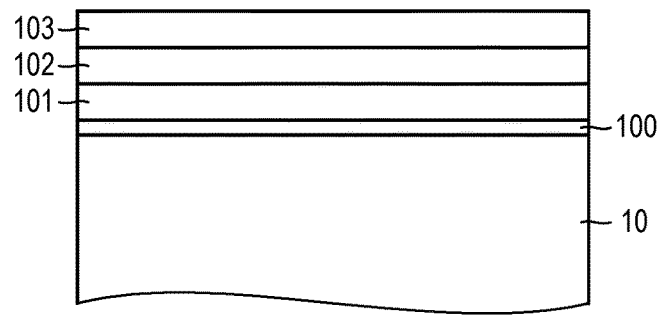
Figure 2:
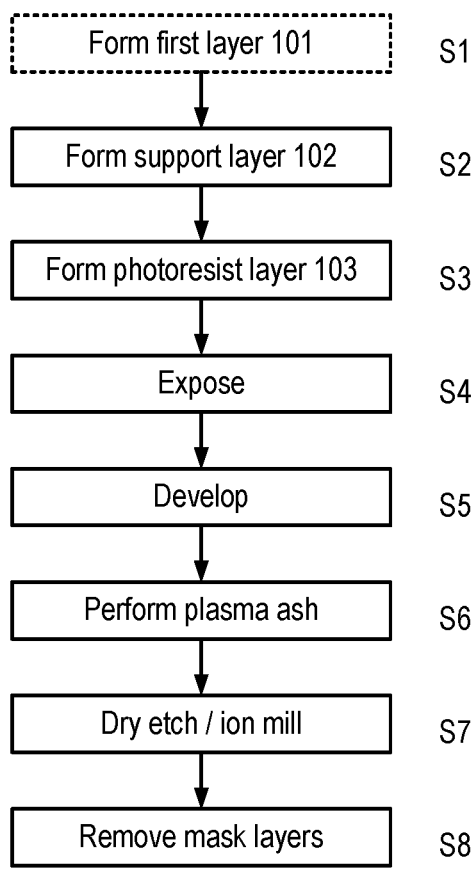
FIG. 2 is a process flow diagram of a method of patterning of a metallic layer on a substrate.

Referring to FIG. 1B and FIG. 2, an optional first layer (or "protective layer") 101 may be deposited on the metallic layer 100 (step S1). As an example, the protective layer 101 may take the form of a layer poly(methyl methacrylate) (PMMA). To form the protective layer or the protective layer 101, PMMA may be dissolved in a solvent such as anisole and spincoated on the substrate comprising the silicon substrate 10 and the metallic layer 100. After spincoating, the protective layer 101 can be baked to harden before depositing an undercut layer or a supporting layer 102.

A supporting layer 102 is deposited on the protective layer 101 (if present) or on the metallic layer 100 (step S2).

As stated hereinbefore, the examples of supporting layer 102 may include any one of PMGI, LOL™ and LOR™. These do not require any adhesion promotor to stick to the protective layer 101 when the protective layer 101 is a PMMA layer. The supporting layer 102 is also spincoated and baked above the glass transition temperature which is around 185 degrees to evaporate the solvent within the layer. Alternatively, the supporting layer 102 may be baked at a temperature lower than the glass transition temperature, such as 160 degrees for 5 minutes, without incurring noticeable intermixing with the supporting layer 102 and the protective layer 101.

A photoresist layer 103 is deposited on the supporting layer 102 (step S3).

The thickness of the protective layer 101 may be around 100 nm and may be between 10 nm and 1 μm. The thickness of the supporting layer 102, in case PMGI is used, may be around 200 nm and may be between 10 nm and 10 μm regardless of the resin composition of the supporting layer 102. The thickness of the photoresist layer 103 may be typically between 800 nm to 7 μm. However, the thickness of the photoresist layer 103 may range from 100 nm to 100 μm, depending on the parameters of the process, for example, the degree of reactive ion etching into the silicon substrate 10.

Figure 1C:
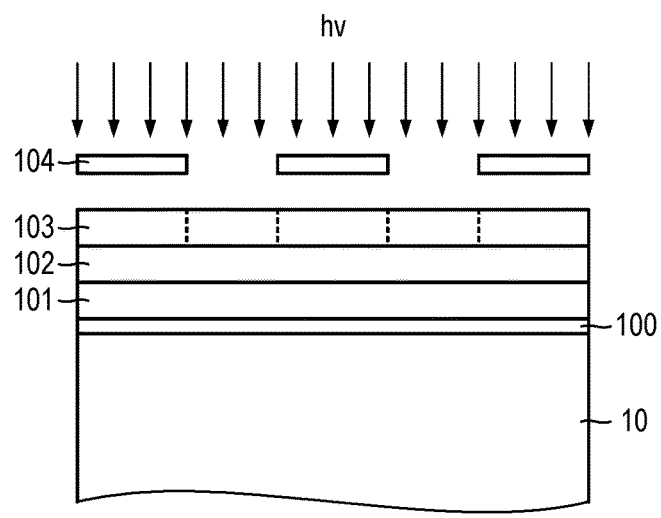

Referring to FIG. 1C and FIG. 2, using a photomask 104, the photoresist layer 103 and the supporting layer 102 are exposed (step S4). Spectral responses of both layers lie around the wavelength range from 240 to 290 nm, which is in the deep UV (DUV) range. Therefore, both the photoresist layer 103 and the supporting layer 102 can be exposed with DUV flood exposure simultaneously. Alternatively, the photoresist layer 103 may be fully patterned and only the exposed part of the supporting layer 102 may be exposed with DUV flood exposure. Alternatively, both layers 102, 103 can be exposed with electron beams. For example, PMGI develops at 1 to 5 Joule/cm² range of DUV, and 30 to 40 μC/cm² range of an electron beam dose. The dose for PMGI is 3 to 5 times less than the dose for PMMA. Exposure dose may be optimised and determined accordingly bearing these parameters in mind.

FIG. 1C shows an example in which the photoresist layer 103 is a positive photoresist. However, a negative photoresist may be used for the photoresist layer. The supporting layer 102, PMGI, LOR™ and LOL™ may be a positive photoresist and require aqueous solvents. When the photoresist layer 103 is a positive photoresist, a minor degree of intermixing can occur near the interface between the photoresist and PMGI because although PMGI is insoluble to most of conventional photoresist solvents, a solvent commonly used for PMGI, cyclopentanone, dissolves most materials used as a photoresist layer. Thorough baking of the supporting layer can, however, help to reduce intermixing. Examples of positive photoresist include a mixture of diazonaphthoquinone (DNQ) and novolac resin (a phenol formaldehyde resin). Examples of negative photoresist include SU-8 photoresist polymer and Off-Stoichiometry Thiol-Enes (OSTE) polymer.

The materials for the photoresist layer 103 are typically designed to provide after developing a non-isotropic slope near the edges for a clean lift-off. The materials for the supporting layer 102 are typically designed to provide an isotropic slope and a controllable degree of undercut or recession after developing. Therefore, the materials for the supporting layer 102 and the photoresist layer 103 may not be used interchangeably. However, any material which can be used as the photoresist layer 103 may be used as a supporting layer 102 if the degree of undercut or recession can be reproducibly controlled and do not lead to severe amount of interlayer mixing with the subsequent photoresist layer 103.

The protective layer 101, for example PMMA layer, may also be exposed to a certain degree at this step. However, if the protective layer 101 is a negative photoresist, it will tend not to be soluble in an aqueous developer if both the photoresist layer and the supporting layer are positive photoresists. Even if the protective layer 101 is a positive resist and dissolved by the developer, the thickness of the protective layer 101 and the exposure dose can be controlled such that mainly only the top two layers are exposed. Furthermore, when the protective layer 101 is a PMMA layer, the amount of dose of DUV light to cause cross-linking of PMMA is substantially larger than the dose required for exposing the supporting layer 102 and the photoresist layer 103. Therefore, the effect of DUV flood exposure on the protective layer 101 may be negligible.

Figure 1D:
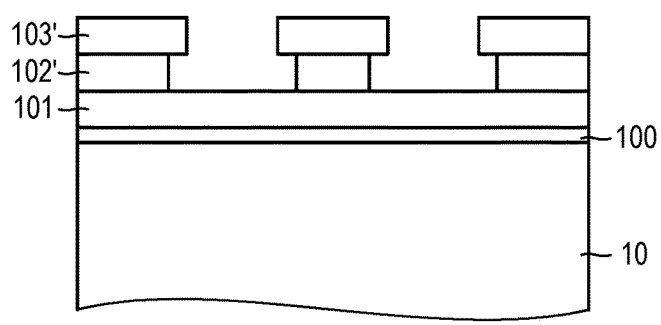

Referring also to FIG. 1D and FIG. 2, the top two layers 102, 103, namely the photoresist layer 103 and the supporting layer 102, may be developed simultaneously if the photoresist layer 103 is of a type that can be developed with the developer used to develop the supporting layer 102, such as TMAH or KOH solutions. Alternatively, the photoresist layer 103 and the supporting layer 102 may be developed using two separate development steps. Due to the presence of the protective layer 101, in the development stage, the metallic layer 100 may not be exposed to the developer (step S5).

At this stage, the patterned supporting layer 102' may recede from the sidewall defined by the patterned photoresist layer 103', thereby forming an overhang feature together with the photoresist. The degree of undercut may be reproducibly controlled by the degree of exposure. The degree of the undercut in the supporting layer 102 can also be controlled with the bake temperature, developer types and the resin composition within the supporting layer 102.

One of the parameters with which the degree of undercut can be controlled is the UV exposure. For example, in order to maximise the undercut, in step S4 as shown in FIG. 1C, after the supporting layer 102 may be formed and baked, the entire supporting layer 102 may be flood exposed with DUV flood exposure before depositing the photoresist layer 103. The supporting layer 102 and the photoresist layer 103 may be developed simultaneously. This is an exemplary procedure to maximise the exposure directly on the supporting layer 102, to maximise the degree of undercut.

As an alternative, after depositing and baking the supporting layer 102, the photoresist layer 103 may be deposited and baked. When the photoresist layer 103 is exposed to be imaged, the supporting layer 102 may be exposed simultaneously as explained in step S4 as shown in FIG. 1C. In this case, the supporting layer 102 is exposed to a lesser degree compared to the example in which the entire supporting layer 102 is exposed, therefore the degree of undercut will be smaller.

As another alternative, after depositing and baking the supporting layer 102, the photoresist layer 103 may be deposited, baked, exposed and developed. After the photoresist layer 103 is fully patterned, the exposed part of the supporting layer 102 may be additionally flood exposed with DUV flood exposure to control the degree of undercut. The exposed regions of the supporting layer 102 are developed at a high rate compared to the unexposed regions of the supporting layer 102, thereby forming an undercut of the supporting layer 102 receding towards the unexposed region of the supporting layer 102.

To keep the degree of undercut to a minimum, the DUV light exposure on the supporting layer 102 may be eliminated. In other words, when the photoresist layer 103 is exposed, the dose and the thickness of the photoresist layer 103 may be controlled such that the supporting layer 102 is not exposed to any DUV light. Even in this case, a certain amount of undercut is expected.

The resin composition of the supporting layer 102 is also an important factor to reproducibly control the degree of undercut. For example, when a specific kind of the supporting layer 102 is used such as NANO LOR resist, a very large degree of undercut may be achieved without any DUV flood exposure.

The degree of undercut may also be determined by the bake time and temperature because the amount of the residual solvent within the supporting layer 102 determines the dissolution rate at the developing stage. For example, in case the supporting layer 102 is PMGI, the bake temperature should be 185° C. or higher up to about 250° C. to remove any residual solvent within the supporting layer 102. However, when the supporting layer 102 is baked at a temperature below 185° C., more solvent will remain in the supporting layer 102. This results in a larger degree of undercut due to a higher dissolution rate.

Another parameter with which the degree of undercut can be controlled is the developer type. Depending on the developer type, the dissolution rate of the supporting layer 102 may vary.

Therefore, the degree of undercut may be reproducibly controlled by optimising the four parameters: the degree of DUV flood exposure, bake temperature, resin composition and developer type. The dissolution rate of the supporting layer 102 and, therefore, the degree of undercut, may be controlled mainly by the bake temperature.

Figure 1E:
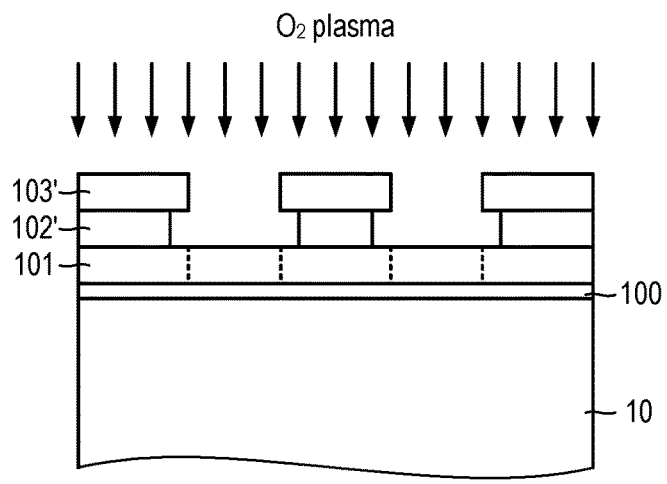
Figure 1F:
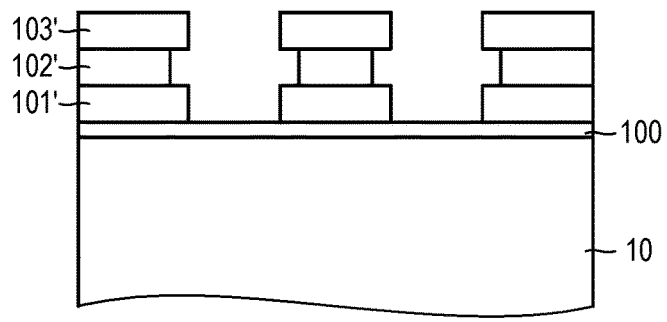

Referring also to FIGS. 1E and 1F and FIG. 2, the protective layer 101 may be etched by reactive ion etching (RIE). If the protective layer 101 is composed of an organic material, such as PMMA, oxygen plasma can be used to selectively remove the organic protection layer without etching into the metallic layer 100 (step S6). A high degree of directionality or anisotropy of etching may be desirable because the protective layer 101 can be etched such that the patterned edge of the patterned protective layer 101' aligns with the patterned edge of the patterned photoresist layer 103'. This feature may provide an additional protection of the edge of the features in the metallic layer 100 from the spurious residues. For anisotropic reactive ion etching, an inductively coupled plasma (ICP) system equipped with asymmetrical configuration of the electrodes can be used with a low pressure of the oxygen in the range of 10s of milliTorr.

Even when the reactive ion etching is arranged to be anisotropic, the protective layer 101, especially when it is a PMMA layer, may recede slightly, also leading to an undercut structure. The degree of recession or undercut may be controlled by the pressure of the oxygen. The recession may be between a few nanometers and several hundred nanometers.

Figure 1G:
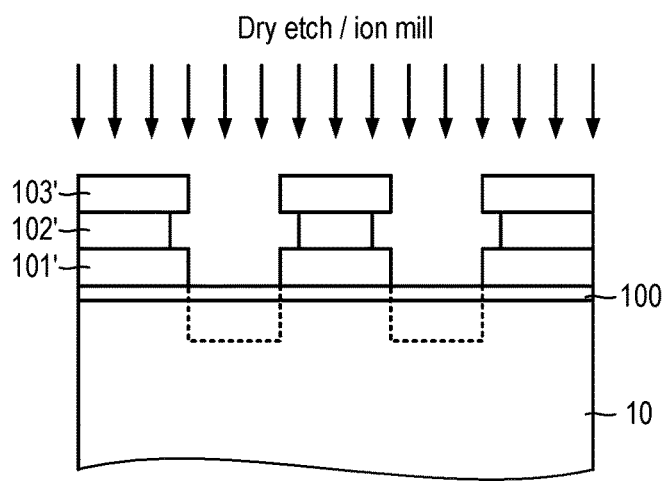

Referring to FIG. 1G and FIG. 2, the metallic layer 100 may be dry etched by ion milling such that the pattern of the patterned protective layer 101' may be transferred to the underlying metallic layer 100 (step S7). A non-reactive gas, such as argon (Ar) can be used for the ion milling. Since the ion milling process is not selective, and involves bombardment of heavy ions, the substrate may be etched once the metallic layer is etched. Especially when the metallic layer 100 is deposited using the sputtering method, a significant amount of debris from the metallic layer 100 may accumulate at the edge of the patterned feature. However, the method for etching in this step is not limited to dry etching such as ion milling. As long as the patterns defined by the photoresist layer 103' and the protective layer 101' can be transferred to the underlying metallic layer 100 in a substantially anisotropic fashion, any other etching method may be employed for this step, for example reactive ion etching with inductively coupled plasma, arranged to provide an anisotropic etching.

The advantages of the protective layer 101 may be as follows.

First, the presence of the protective layer 101 may prevent the creation of a continuous hardened film on top of the metallic layer 100 and renders removing of the photoresist layer 103 easier since the solvent can easily dissolve the undamaged part of the photoresist layer 103.

Secondly, although the heavy ions reflected off the walls within the patterned hole may also harden the protective layer 101, the thickness of the protective layer 101 may be kept small, for example 100 nm for the PMMA layer. Therefore, there may be only small portion of the sidewall exposed within the pattern to harden. This is in contrast to the typical thickness of the photoresist layer 103, which is around 1 µm.

Thirdly, as discussed in relation to FIGS. 1E and 1F and step S6, the reactive ion etching step to remove the protective layer 101 causes the sidewall of the protective layer 101 to recede slightly. This degree of recession may be controlled such that the protective layer 101 is not severely exposed to the bombarding of the heavy ions while protecting the edges from spurious particles. Therefore, the protective layer 101 can protect the edge of the patterned feature without leaving hardened part of the protective layer 101 in contact with the metallic layer 100.

Figure 1H:
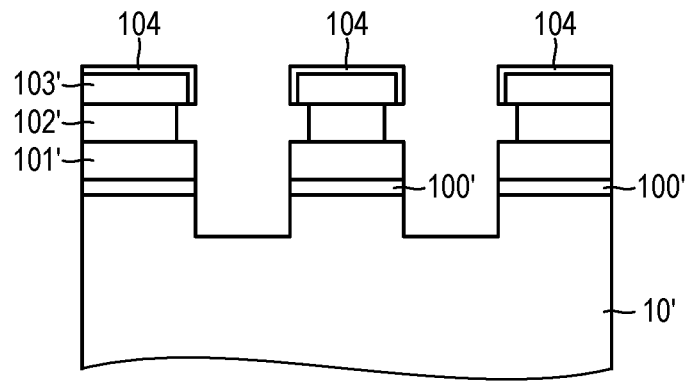

Referring also to FIG. 1H and FIG. 2, the photoresist layer 103' bombarded by heavy ions result in a hardened photoresist regions 104 (or "caps") at the exposed surfaces of the patterned photoresist layer 103'. However, these regions 104 are spaced apart from the patterned metallic layer 100' by the patterned supporting layer 102' and, if present, the patterned protective layer 101'. Also, the edges of the feature in the patterned metallic layer 100' are protected by the protective layer 101. This is in contrast to the case without the protective layer, where the receded part of supporting layer exposes the edges of the features in the metallic layer 100. Therefore, the edges of the features in the patterned metallic layer 100' are not exposed to the possible dielectric or metallic residues.

Figure 1J:
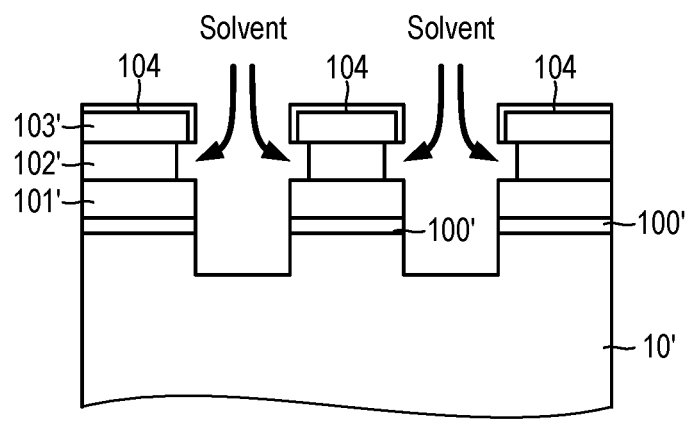

Referring to FIG. 1J and FIG. 2, the patterned protective layer 101', the patterned supporting layer 102', and the patterned photoresist layer 103' may be removed using a solvent (step S8). Using a three-layer structure can make it easier for solvent to enter under the resist and assist cleaner lift-off of the layers. A suitable stripping method, such as isotropic oxygen plasma, can be used. Heated N-Methyl-2-pyrrolidone (NMP) can be used for this step.

Figure 1K:
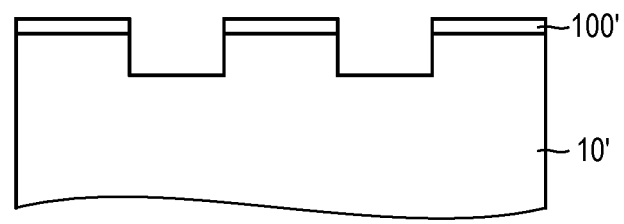

FIG. 1K shows the patterned metallic layer 100' following the steps described above. The metallic layer 100 may be much less prone to hardened photoresist residues or particles from the metallic layer 100 and the substrate 10.

Figure 3A:
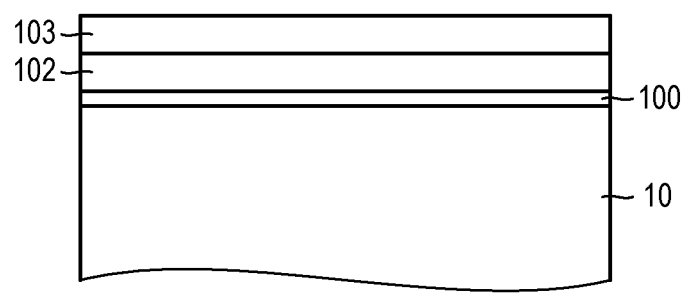
FIGS. 3A and 3B illustrate a two-layer structure before and after development which can be used as an alternative to a three-layer structure.

Referring to FIG. 3A, as explained earlier, a two-layer structure can be used instead of a three-layer structure. The supporting layer 102 may be deposited directly on the metallic layer 100. The photoresist layer 103 may be deposited on the supporting layer 102. In this case, a two-layer structure 102, 103 is formed instead of the three-layer structure 101, 102, 103 shown in FIG. 1B. The same materials and the same or processes as those hereinbefore described can be used to form the two-layer structure and so will be not described again here in detail. However, processing parameters, such as layer thickness and/or baking time, may be adapted to accommodate a two-layer structure. Having been formed, the two-layer structure may be processed using the same or similar process used to process the three-layer structure. However, processing parameters, such as dose and/or development time, may be adapted to accommodate a two-layer structure. In contrast to the three-layer structure, there may be significant intermixing between the protective layer 101 and the photoresist layer 103, without the supporting layer 102 in between the two layers.

Figure 3B:
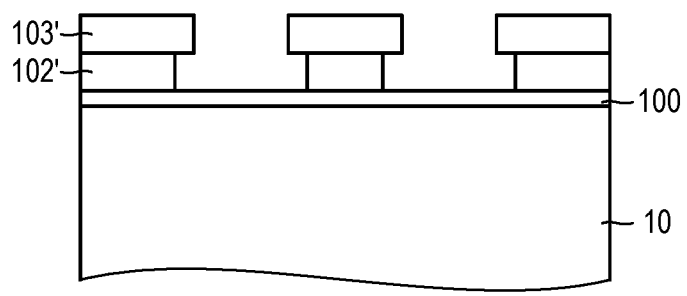

Referring to FIG. 3B, the same process hereinbefore described with reference to FIGS. 1A to AK and FIG. 2 can be followed starting from the two-layer structure 102, 103 shown in FIG. 3A. After oxygen plasma treatment step (step S6) and before dry etching step (step S7), the patterned supporting layer 102' and a patterned photoresist layer 103' form a two-layered undercut profiles as shown in FIG. 3B, instead of the three-layered structure shown in FIG. 1F. In this case, the edge of the features in the metallic layer 300 is not protected from the re-deposition of material and/or resist residue.

As discussed above, the metallic layer 100, which can show superconducting behaviour below a critical temperature, may be the main layer which contains the key elements and components contributing to performing the quantum information processing. The whole or part of these elements and components, for example, Josephson junction, co-planar waveguides, LC oscillator, superconducting quantum interference devices (SQUIDs), inductors and capacitors, are defined as patterns on the metallic layer, ideally with clean and well-defined edges. For example, co-planar waveguides may defined as strips in the metallic layer 100. The process described herewithin can be used to provide a cleaner edge on these strips, which will substantially reduce loss arising from the imperfections residing near the edge of these strips. Furthermore, the process described herewithin can prevent the residues from remaining near the edges of the patterns, which may lead to loss or decoherence due to the material defects such as two-level states (TLS). Clean and well-defined edges obtained from the process described herewithin also prevents adverse effects on the subsequent layers. Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Other materials may be used for the metallic layer and the substrate. For example, the metallic layer may be another superconducting metal, such as niobium or tin, or a superconducting alloy. The substrate may be sapphire or a suitable dielectric material. The substrate may be a multi-layer substrate, such as silicon-on-insulator.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computing systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, molecules, electrons, photons, ions, quantum dots or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DCSQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form.

In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computing system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination.

Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Other implementations are within the scope of the following claims.

What is claimed is:

1. A method of fabricating a device, comprising:
   providing a substrate, wherein the substrate comprises a metal layer on a principal surface of the substrate;
   forming a multilayer stack on the metal layer, the multilayer stack comprising:
      a first polymer layer;
      a second polymer layer on the first polymer layer, wherein the second polymer layer is in contact with a surface of the first polymer layer; and
      a third polymer layer on the second polymer layer, wherein the third polymer layer is in contact with a surface of the second polymer layer;
   patterning the multilayer stack to form opening through the multilayer stack such that, within the opening, the third polymer layer is undercut by the second polymer layer and the second polymer layer is overcut by the first polymer layer,
   wherein patterning the multilayer stack to form the opening comprises
      exposing the third polymer layer and the second polymer layer,
      developing the third polymer layer and the second polymer layer, wherein during development of the second polymer layer, the second polymer layer recedes relative to the third polymer layer to form an undercut profile with respect to the third polymer layer,
      dry etching the first polymer layer;
   dry etching the metal layer to form a patterned metal layer of the device; and
   removing the multilayer stack,
   wherein the device comprises a quantum computing circuit element.

2. The method of claim 1, wherein the third polymer layer and the second polymer layer are exposed simultaneously.

3. The method of claim 1, wherein the third polymer layer is exposed and developed before the second polymer layer is exposed and developed.

4. The method of claim 1, wherein exposing the third polymer layer and the second polymer layer comprises exposing the third polymer layer and the second polymer layer with electron beams.

5. The method of claim 1, wherein the first polymer layer is poly (methyl methacrylate) (PMMA), and the second polymer layer comprises polydimethylglutarimide (PMGI).

6. The method of claim 1, wherein the second polymer layer and the third polymer layer are different materials.

7. The method of claim 6, wherein the second polymer layer and the third polymer layer are developed simultaneously using a developer solution, wherein exposed portions of the third polymer layer are less soluble in the developer solution than exposed portions of the second polymer layer.

8. The method of claim 6, wherein the entire second polymer layer is flood exposed with deep ultraviolet light before the third polymer layer is formed on the second polymer layer.

9. The method of claim 6, wherein the third polymer layer and the second polymer layer are exposed simultaneously.

10. The method of claim 9, wherein, after developing the third polymer layer, the second polymer layer is exposed a second time.

11. The method of claim 1, wherein dry etching the first polymer layer comprises performing reactive ion etching of the first polymer layer.

12. The method of claim 1, wherein the first polymer layer recedes laterally as a result of the dry etching.

13. The method of claim 12, comprising controlling a degree of recession of the first polymer layer during the dry etching.

14. The method of claim 1, wherein dry etching the metal layer comprises ion milling the metal layer.

15. The method of claim 1, wherein dry etching the metal layer comprises performing reactive ion etching of the metal layer.

16. The method of claim 1, wherein a thickness of the first polymer layer is between 10 nm and 100 nm.

17. The method of claim 1, wherein the metal layer comprises a superconductor.

18. The method of claim 1, wherein the device comprises a Josephson junction, a superconducting quantum interference device (SQUID) or a qubit.

* * * * *